(12) United States Patent
Saiki et al.

(10) Patent No.: US 10,411,151 B2
(45) Date of Patent: Sep. 10, 2019

(54) METHOD OF MANUFACTURING SOLAR CELL MODULE AND SOLAR CELL MODULE

(71) Applicant: SANYO Electric Co., Ltd., Osaka (JP)

(72) Inventors: Shintaro Saiki, Gifu (JP); Atsushi Saita, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 524 days.

(21) Appl. No.: 14/578,727

(22) Filed: Dec. 22, 2014

(65) Prior Publication Data

US 2015/0118783 A1    Apr. 30, 2015

Related U.S. Application Data

(63) Continuation of application No. PCT/JP2012/066322, filed on Jun. 27, 2012.

(51) Int. Cl.
*H01L 31/0203* (2014.01)
*H01L 31/048* (2014.01)
(Continued)

(52) U.S. Cl.
CPC .... *H01L 31/1876* (2013.01); *H01L 31/02327* (2013.01); *H01L 31/049* (2014.12); *Y02E 10/50* (2013.01)

(58) Field of Classification Search
CPC . H01L 31/048; H01L 31/0481; H01L 31/049; B32B 2457/12
See application file for complete search history.

(56) References Cited

U.S. PATENT DOCUMENTS 5,728,230 A * 3/1998 Komori ............. B32B 17/02
136/251
6,320,115 B1 * 11/2001 Kataoka ............. B32B 17/04
136/251
(Continued)

FOREIGN PATENT DOCUMENTS

JP    2003-258283 A    9/2003
JP    2012-119434 A    6/2012

OTHER PUBLICATIONS

Alves, N.M. et al.: Viscoelastic Behavior of Poly(methyl methacrylate) Networks with Different Cross-Linking Degrees; Nanotechnology, 34, 2004, 3735-3744.

*Primary Examiner* — Bradley Smith
*Assistant Examiner* — David J Goodwin
(74) *Attorney, Agent, or Firm* — Metrolexis Law Group, PLLC

(57) ABSTRACT

A stacked body is obtained by stacking a glass plate, a transparent resin sheet, a solar cell, a colored resin sheet, and a first resin sheet in the order. The stacked body is pressed under heat to fabricate the solar cell module. The module includes the glass plate, a transparent sealing layer placed between the glass plate and the solar cell and formed of the transparent resin sheet, a colored sealing layer placed between the first resin sheet and the solar cell and formed of the colored resin sheet, and the first resin sheet. One of the transparent resin sheet and the colored resin sheet has a tan δ of 1 or higher at a temperature of the pressing, and the other one of the transparent resin sheet and the colored resin sheet has a tan δ of less than 1 at the temperature of the pressing.

7 Claims, 1 Drawing Sheet

(51) Int. Cl.
   *H01L 31/18*     (2006.01)
   *H01L 31/0232*   (2014.01)
   *H01L 31/049*    (2014.01)

(56) References Cited

U.S. PATENT DOCUMENTS

| | | | | |
|---|---|---|---|---|
| 6,414,236 | B1* | 7/2002 | Kataoka | B32B 17/10678 |
| | | | | 136/244 |
| 8,551,803 | B2* | 10/2013 | Yuuki | B32B 17/10036 |
| | | | | 438/64 |
| 2004/0182432 | A1* | 9/2004 | Yoda | H01L 31/048 |
| | | | | 136/244 |
| 2007/0251572 | A1* | 11/2007 | Hoya | C08L 23/0815 |
| | | | | 136/256 |
| 2010/0154867 | A1* | 6/2010 | Bennison | B32B 17/10036 |
| | | | | 136/251 |
| 2011/0189807 | A1* | 8/2011 | Yuuki | B32B 17/10036 |
| | | | | 438/66 |
| 2011/0311742 | A1* | 12/2011 | Kadowaki | B65D 85/808 |
| | | | | 428/35.2 |
| 2013/0005071 | A1* | 1/2013 | Hiraike | C09J 151/06 |
| | | | | 438/73 |
| 2013/0203203 | A1* | 8/2013 | Uenomachi | H01L 31/03926 |
| | | | | 438/64 |
| 2013/0210186 | A1* | 8/2013 | Hiraike | B32B 27/304 |
| | | | | 438/64 |
| 2013/0247963 | A1 | 9/2013 | Ishiguro | |
| 2013/0323521 | A1* | 12/2013 | Xia | C09J 133/08 |
| | | | | 428/523 |
| 2014/0014178 | A1* | 1/2014 | Muguruma | H01L 31/0481 |
| | | | | 136/259 |
| 2014/0130851 | A1* | 5/2014 | Osamura | B32B 25/18 |
| | | | | 136/251 |

\* cited by examiner

METHOD OF MANUFACTURING SOLAR CELL MODULE AND SOLAR CELL MODULE

CROSS REFERENCE TO RELATED APPLICATIONS

This application is a continuation application of International Application No. PCT/JP2012/066322 filed on Jun. 27, 2012, entitled "METHOD OF MANUFACTURING A SOLAR CELL MODULE AND SOLAR CELL MODULE", the entire contents of which are incorporated herein by reference.

TECHNICAL FIELD

The disclosure relates to a method of manufacturing a solar cell module and a solar cell module.

BACKGROUND ART

There is conventionally known a solar cell module having solar cells provided inside a sealing layer placed between a light-receiving surface member and a rear surface member. For example, Japanese Patent Application Publication No. 2003-258283 (referred to as Patent Document 1) describes a configuration in which a portion of the sealing layer located between the light-receiving surface member and the solar cells is formed of a transparent ethylene-vinyl acetate copolymer (EVA) film and a portion of the sealing layer located between the rear surface member and the solar cells is formed of a colored EVA film. Patent Document 1 states that use of the colored EVA film can improve the output characteristics of the solar cell module.

SUMMARY OF THE INVENTION

The solar cell module described in Patent Document 1 can be manufactured by, for example, thermocompression of a stacked body in which solar cells are placed between a colored EVA film and a transparent EVA film.

However, when such a manufacturing method is used to manufacture the solar cell module described in Patent Document 1, the colored EVA may result in being located on the receiving surfaces of the solar cells as well, which lowers the output characteristics of the solar cell module.

A method of manufacturing a solar cell module according to an embodiment obtains a stacked body by stacking a glass plate, a transparent resin sheet, a solar cell, a colored resin sheet, and a first resin sheet in the order mentioned. The stacked body is pressed under heat to fabricate the solar cell module including the glass plate, a transparent sealing layer placed between the glass plate and the solar cell and formed of the transparent resin sheet, a colored sealing layer placed between the first resin sheet and the solar cell and formed of the colored resin sheet, and the first resin sheet. One of the transparent resin sheet and the colored resin sheet has a tan δ of 1 or higher at a temperature of the pressing, and the other one of the transparent resin sheet and the colored resin sheet has a tan δ of less than 1 at the temperature of the pressing.

A solar cell module according to an embodiment includes a glass plate, a resin sheet, a sealing layer, and a solar cell. The resin sheet faces the glass plate. The sealing layer is placed between the glass plate and the resin sheet. The solar cell is placed inside the sealing layer. The sealing layer includes a transparent sealing layer and a colored sealing layer. The transparent sealing layer is located between the solar cell and the glass plate. The colored sealing layer is located between the solar cell and the resin sheet. One of the transparent sealing layer and the colored sealing layer has a tan δ of 1 or higher at 125° C., and the other one of the transparent sealing layer and the colored sealing layer has a tan δ of less than 1 at 125° C.

EMBODIMENTS

Figure 1:
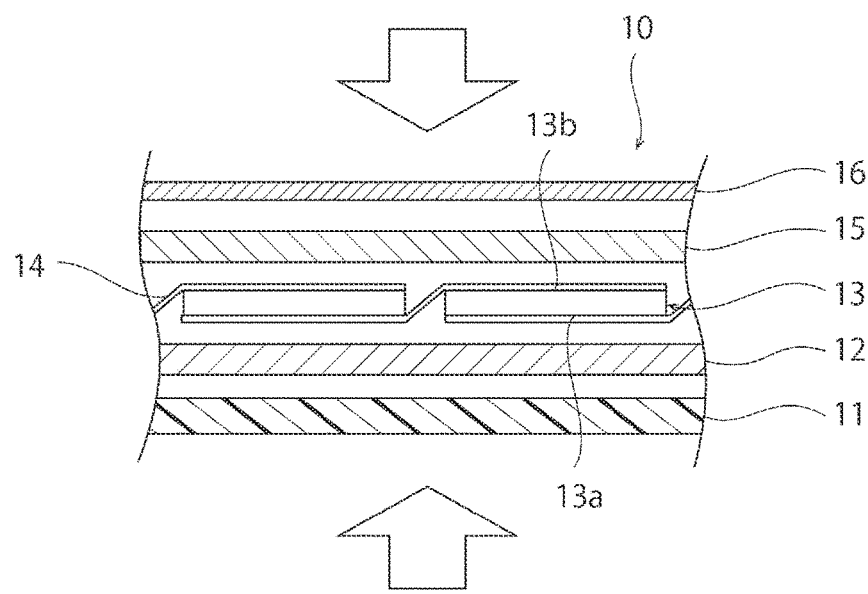
FIG. 1 is a schematic, exploded sectional diagram of a stacked body according to one embodiment.

Hereinafter, examples of preferred embodiments carrying out the invention are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

(Method of Manufacturing Solar Cell Module 1)

Figure 2:
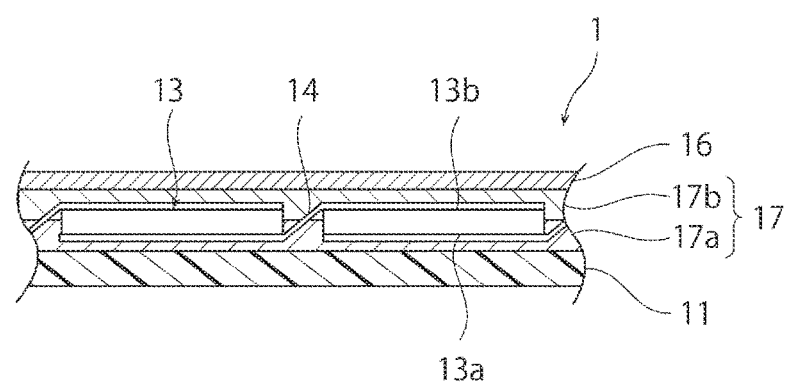
FIG. 2 is a schematic sectional diagram of a solar cell module according to one embodiment.

A method of manufacturing solar cell module 1 illustrated in FIG. 2 is described with reference to FIGS. 1 and 2.

To manufacture solar cell module 1, stacked body 10 illustrated in FIG. 1 is fabricated first. Specifically, stacked body 10 is fabricated by stacking glass plate 11, transparent resin sheet 12, solar cells 13, colored resin sheet 15, and resin sheet 16, in the order mentioned.

Transparent resin sheet 12 transmits at least part of light which can contribute to photoelectric conversion in solar cells 13. Preferably, transparent resin sheet 12 contains substantially no pigment or dye.

Colored resin sheet 15 reflects at least part of light which can contribute to photoelectric conversion in solar cells 13. Preferably, colored resin sheet 15 contains at least one of pigment and dye. For example, colored resin sheet 15 preferably contains titanium-oxide particles. The color tone of colored resin sheet 15 does not necessarily have to be white. The color tone of colored resin sheet 15 may be, for example, black or the like.

For example, between transparent resin sheet 12 and colored resin sheet 15, single solar cell 13 may be placed, or multiple solar cells 13 electrically connected together by wiring member 14 may be placed.

The type of solar cell 13 is not particularly limited. Solar cell 13 may be, for example, one having a substrate made of crystal semiconductor material. Examples of the substrate made of crystal semiconductor material include a crystal silicon substrate. Solar cell 13 has mainly light-receiving surface 13a and rear surface 13b. Solar cell 13 is placed such that light-receiving surface 13a faces the glass plate 11 side and that rear surface 13b faces the resin sheet 16 side.

Resin sheet 16 is flexible. Resin sheet 16 can be formed from, for example, a polyethylene terephthalate (PET) resin, a polyvinyl fluoride resin (PVF), a polyvinylidene fluoride (PVDF) resin, or a complex of these. Resin sheet 16 may have a barrier layer made of metal or an inorganic oxide, but is preferably formed of a resin sheet made of substantially only resin.

Next, stacked body 10 is pressed while being heated (heat pressing step). Thereby, solar cell module 1 illustrated in FIG. 2 is completed. In the heat pressing step, the temperature for heating stacked body 10 is, for example, about 100° C. to 160° C., or preferably, about 130° C. to 150° C. The temperature for heating stacked body 10 can be, for example, about 125° C.

Solar cell module 1 includes glass plate 11 and resin sheet 16. Resin sheet 16 faces glass plate 11 with a space therebetween. Between resin sheet 16 and glass plate 11, sealing layer 17 is placed, which includes colored resin sheet 15 and transparent resin sheet 12. Sealing layer 17 has transparent sealing layer 17a formed of transparent resin sheet 12 and colored sealing layer 17b formed of colored resin sheet 15. Transparent sealing layer 17a is placed between glass plate 11 and solar cells 13. Colored sealing layer 17b is placed between resin sheet 16 and solar cells 13. Thus, transparent sealing layer 17a is located on a side where light-receiving surfaces 13a of solar cells 13 are provided, and colored sealing layer 17b is located on a side where rear surfaces 13b of solar cells 13 are provided.

When a stacked body having a solar cell located between a transparent resin sheet and a colored resin sheet is pressed under heat, the colored resin may result in being located on the light-receiving surface of the solar cell, as well. In such a case, the colored resin located on the light-receiving surface reflects or absorbs light trying to enter the solar cell. This lowers the amount of light entering the solar cell, and consequently lowers the output characteristics of the solar cell module.

As a result of intense study, the inventors have found that the colored resin results in being located on the light-receiving surface due to the following two causes (1) and (2).

(1) Part of the colored resin sheet goes around to light-receiving surface 13a.
(2) The colored resin sheet melted and the transparent resin sheet melted are mixed together on the light-receiving surface.

Among these causes (1) and (2), when (2) occurs, i.e., when the melted colored resin sheet and the melted transparent resin sheet are mixed together, the colored resin tends to occupy a large portion of the light-receiving surface. Hence, from the perspective of improving the output characteristics, it is important to suppress the mixing of the melted colored resin sheet and the melted transparent resin sheet.

Thus, in this embodiment, one of transparent resin sheet 12 and colored resin sheet 15 has a tan δ of less than 1 at the temperature of pressing stacked body 10 (e.g., 125° C.), and the other one of them has a tan δ of 1 or higher at the temperature of pressing stacked body 10 (e.g., 125° C.). This suppresses mixing of melted transparent resin sheet 12 and melted colored resin sheet 15 when stacked body 10 is pressed. Thus, the following is suppressed: the transparent resin contained in transparent resin sheet 12 and the colored resin contained in colored resin sheet 15 are mixed with each other to form a mixed resin and are located on light-receiving surface 13a. As a result, solar cell module 1 with improved output characteristics can be obtained. Thus, by making one of transparent sealing layer 17a and colored sealing layer 17b have a tan δ of 1 or higher at 125° C. and making the other one of them have a tan δ of less than 1 at 125° C., the output characteristics of solar cell module 1 can be improved.

From the perspective of obtaining output characteristics improved even more, it is preferable that one of transparent resin sheet 12 and colored resin sheet 15 have a tan δ of 0.19 or higher at the temperature of pressing stacked body 10.

When both of the transparent resin sheet and the colored resin sheet have a tan δ of one or higher at the pressing temperature, the transparent resin sheet melted and the colored resin sheet melted tend to be mixed with each other. Thus, it is likely that the mixed resin of the transparent resin and the colored resin results in being located on the light-receiving surface. Thus, the solar cell module is likely to have low output characteristics.

On the other hand, when both of the transparent resin sheet and the colored resin sheet have a tan δ of less than one at the pressing temperature, a gap tends to be created between the transparent sealing layer and the colored sealing layer, and this gap may lower the moisture resistance of the solar cell module. In addition, during the pressing, an increased stress is applied to the solar cells via the transparent resin sheet and the colored resin sheet. Thus, the solar cells easily get microcracks or the like.

When one of transparent resin sheet 12 and colored resin sheet 15 has a tan δ of less than 1 at the temperature of pressing stacked body 10 and the other one of them has a tan δ of 1 or higher at the temperature of pressing stacked body 10, adhesion between transparent sealing layer 17a and colored sealing layer 17b is high, so that a gap is unlikely to be generated between transparent sealing layer 17a and colored sealing layer 17b. Thus, solar cell module 1 with improved moisture resistance can be obtained. In addition, a stress applied to solar cell 13 via transparent resin sheet 12 and colored resin sheet 15 during the pressing can be reduced. Thus, generation of microcracks or the like in solar cell 13 can be suppressed.

A tan δ is a loss tangent (loss coefficient) which is the ratio of a loss elastic modulus (G") to a storage elastic modulus (G') (G"/G'). A tan δ represents the ratio of a viscous component of a material to an elastic component of the material. It should be noted that when a measured object breaks during the measurement of tan δ and therefore cannot be measured, the tan δ is considered to be 1 or higher.

For example, a resin sheet with a tan δ of less than 1 at the pressing temperature may be used as colored resin sheet 15, and a resin sheet with a tan δ of 1 or higher at the pressing temperature may be used as transparent resin sheet 12. Colored sealing layer 17b may have a tan δ of less than 1 at 125° C., and transparent sealing layer 17a may have a tan δ of 1 or higher at 125° C.

For example, a resin sheet with a tan δ of 1 or higher at the pressing temperature may be used as colored resin sheet 15, and a resin sheet with a tan δ of less than 1 at the pressing temperature may be used as transparent resin sheet 12. Colored sealing layer 17b may have a tan δ of 1 or higher at 125° C., and transparent sealing layer 17a may have a tan δ of less than 1 at 125° C.

If resin sheet 16 does not have a barrier layer and is formed of a resin sheet made of substantially only resin, the coefficient of thermal expansion of resin sheet 16 is higher than that in a case a barrier layer is provided. In such a case, it is preferable that colored resin sheet 15 located on resin sheet 16 have a tan δ of less than 1. By thus making colored resin sheet 15 have a tan δ of less than 1, deformation of colored resin sheet 15 due to the extension and contraction of resin sheet 16 is suppressed. Thus, application of stress to solar cell 13 can be suppressed.

The examples described below use crosslinked polyolefin for the resin with a tan δ of less than 1 at 125° C. and non-crosslinked polyolefin for the resin with a tan δ of 1 or higher at 125° C.

The tan δ can be measured in the following manner.

First, a sample having a rectangular shape in plan view with a length of 5 mm, a width of 10 mm, and a thickness of 0.6 mm is prepared. The tan δ of the sample can be measured while pulling both end portions of the sample in a longitudinal direction.

Example 1

A stacked body is obtained by stacking, in the order mentioned, a glass plate with a thickness of 3.2 mm, a transparent resin sheet made of crosslinked polyolefin and having a thickness of 0.6 mm (tan δ at 125° C.=0.7), a solar cell, a colored resin sheet made of non-crosslinked polyolefin and having a thickness of 0.6 mm (tan δ at 125° C.=1 or higher), and a resin sheet made of non-crosslinked polyolefin and having a thickness of 0.3 mm. Then, the stacked body is pressed while being heated to a temperature of 150° C.

Example 2

A solar cell module is fabricated in a similar manner to Example 1, except for using a resin sheet made of non-crosslinked polyolefin and having a thickness of 0.6 mm (tan δ at 125° C.=1 or higher) as the transparent resin sheet and using a resin sheet made of crosslinked polyolefin and having a thickness of 0.6 mm (tan δ at 125° C.=0.7) as the colored resin sheet.

Comparative Example 1

A solar cell module is fabricated in a similar manner to Example 1, except for using a resin sheet made of non-crosslinked polyolefin and having a thickness of 0.6 mm (tan δ at 125° C.=1 or higher) as the colored resin sheet and using a resin sheet made of non-crosslinked polyolefin and having a thickness of 0.6 mm (tan δ at 125° C.=1 or higher) as the transparent resin sheet.

Evaluation

The solar cell modules fabricated in Examples 1 and 2 and Comparative Example 1 are observed from the glass plate side to check whether there is colored resin present on the light-receiving surface. As a result, in Examples 1 and 2, substantially no colored resin is present on the light-receiving surface. In Comparative Example 1, colored resin is present along the entire peripheral edge portion of the light-receiving surface.

In this way, the embodiments provide solar cell modules that have improved output characteristics.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A method of manufacturing a solar cell module, the method comprising:
    obtaining a stacked body by stacking sequentially a glass plate, a transparent resin sheet, a solar cell, a colored resin sheet, and a first resin sheet; and
    pressing the stacked body under heat to fabricate the solar cell module including the glass plate,
        a transparent sealing layer placed between the glass plate and the solar cell and formed of the transparent resin sheet,
        a colored sealing layer placed between the first resin sheet and the solar cell and formed of the colored resin sheet, and
        the first resin sheet, wherein
    one of the transparent resin sheet and the colored resin sheet is made of non-crosslinked polyolefin and has a tan δ of 1 or higher at a temperature of the pressing, and
    the other one of the transparent resin sheet and the colored resin sheet has a tan δ of less than 1 at the temperature of the pressing.

2. The method of manufacturing a solar cell module according to claim 1, wherein
    the colored resin sheet has a tan δ of less than 1 at the temperature of the pressing, and
    the transparent resin sheet has a tan δ of 1 or higher at the temperature of the pressing.

3. The method of manufacturing a solar cell module according to claim 1, wherein
    the colored resin sheet has a tan δ of 1 or higher at the temperature of the pressing, and
    the transparent resin sheet has a tan δ of less than 1 at the temperature of the pressing.

4. The method of manufacturing a solar cell module according to claim 1, wherein
    a sheet made of resin is used as the first resin sheet.

5. The method of manufacturing a solar cell module according to claim 1, wherein
    the temperature of the pressing is 125 degrees Celsius.

6. The method of manufacturing a solar cell module according to claim 1, wherein
    the tan δ of the other one of the transparent resin sheet and the colored resin sheet is 0.19 or higher at the temperature of the pressing.

7. The method of manufacturing a solar cell module according to claim 1, wherein the other one of the transparent resin sheet and the colored resin sheet is made of a crosslinked resin.

* * * * *